(12) United States Patent
Hong

(10) Patent No.: US 8,710,521 B2
(45) Date of Patent: Apr. 29, 2014

(54) ORGANIC LIGHT EMITTING DISPLAY DEVICE AND METHOD OF MANUFACTURING THE SAME

(75) Inventor: Sang-Min Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/598,490

(22) Filed: Aug. 29, 2012

(65) Prior Publication Data

US 2013/0320367 A1    Dec. 5, 2013

(30) Foreign Application Priority Data

May 30, 2012   (KR) .................. 10-2012-0057473

(51) Int. Cl.
    *H01L 51/54*    (2006.01)
(52) U.S. Cl.
    USPC .................................. 257/89; 257/E51.022

(58) Field of Classification Search
    USPC ............... 257/89, 40, 79, E51.022, E27.152, 257/E27.131; 313/504
    See application file for complete search history.

(56) References Cited

U.S. PATENT DOCUMENTS

2008/0211395 A1* 9/2008 Koshihara et al. ............ 313/504
2009/0295283 A1* 12/2009 Kim et al. ..................... 313/504

FOREIGN PATENT DOCUMENTS

KR    10-2011-0066455      6/2011
KR    10-2011-0085471 A    7/2011

* cited by examiner

*Primary Examiner* — Whitney T Moore
(74) *Attorney, Agent, or Firm* — Christie, Parker & Hale, LLP

(57) ABSTRACT

An organic light emitting display device including a plurality of sub pixels, each of the sub pixels including an emissive layer between a pixel electrode and a counter electrode; and a partition wall defining regions of the plurality of sub pixels, wherein the partition wall is not located between at least one pair of adjacent sub pixels of the plurality of sub pixels.

12 Claims, 5 Drawing Sheets

ORGANIC LIGHT EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0057473, filed on May 30, 2012, in the Korean Intellectual Property Office, the disclosure of which is incorporated herein in its entirety by reference.

BACKGROUND

1. Field

Embodiments of the present invention relate to an organic light emitting display device, and more particularly, to an organic light emitting display device having a spacer structure so as to reduce the occurrence of dark spots caused by short circuits, and a method of manufacturing the same.

2. Description of the Related Art

Generally, an organic light emitting display device realizes (or produces) a color by emitting light when recombining holes and electrons respectively injected from an anode and a cathode in a light emitting unit, and has a stacked structure wherein the light emitting unit is located between a pixel electrode that acts as the anode and a counter electrode that acts as the cathode.

A unit pixel of such an organic light emitting display device includes red, green, and blue sub pixels, and a desired color is expressed by combining light emitted by these red, green, and blue sub pixels. In other words, the organic light emitting display device has a structure where a light emitting unit for emitting any one of red, green, and blue light is disposed between the anode and the cathode per each sub pixel, and a color of light emitted by a unit pixel is expressed according to a suitable combination of these three colors emitted by the sub pixels of the unit pixel.

The sub pixels are separated from each other into individual regions by partition walls, such as pixel defining layers or spacers, and bottom layers of the sub pixels may easily crack due to the partition walls when an external force is applied. In other words, since a partition wall, such as a pixel defining layer or spacer, protrudes upward between the sub pixels to form a stepped portion, when an external force is applied to the partition wall, stress is concentrated in the stepped portion, and thus the bottom layer of the partition wall is easily cracked. In this case, a short circuit may occur when the anode and the cathode directly contact each other through the crack, and a sub pixel where the short occurs becomes a dark spot, e.g., a dead pixel.

SUMMARY

In order to realize a more stable organic light emitting display device, embodiments of the present invention are directed to a structure capable of reducing the risk of dark spots occurring.

Embodiments of the present invention provide an organic light emitting display device capable of suppressing or reducing generation of dark spots caused by a short circuit, and a method of manufacturing the same.

According to one embodiment of the present invention, an organic light emitting display device includes: a plurality of sub pixels, each of the sub pixels including an emissive layer between a pixel electrode and a counter electrode; and a partition wall defining regions of the plurality of sub pixels, wherein the partition wall is not located between at least one pair of adjacent sub pixels of the plurality of sub pixels.

The emissive layer of each of the plurality of sub pixels may be adapted to emit any one of red, green, and blue light, and the emissive layers of the at least one pair of adjacent sub pixels are adapted to emit light of the same color.

The emissive layers of the at least one pair of adjacent sub pixels may be connected to each other.

A part of the partition wall outside of the at least one pair of sub pixels may has a single layer.

The partition wall may include a pixel defining layer and a spacer on the pixel defining layer.

According to another aspect of the present invention, there is provided a method of manufacturing an organic light emitting display device, the method including: forming a pixel electrode in each of a plurality of sub pixels; forming a partition wall defining regions of the plurality of sub pixels, wherein the partition wall is not located between at least one pair of adjacent sub pixels of the plurality of sub pixels; forming an emissive layer on the pixel electrode of each of the plurality of sub pixels; and forming a counter electrode on the emissive layer.

The emissive layer of each of the plurality of sub pixels may be adapted to emit one of red, green, and blue light, and the at least one pair of adjacent sub pixels comprise emissive layers adapted to emit light of the same color.

The emissive layers of the at least one pair of adjacent sub pixels may be connected to each other.

A part of the partition wall outside of the at least one pair of adjacent sub pixels may have a single layer.

The partition wall may include a pixel defining layer and a spacer on the pixel defining layer and the method may further include removing the spacer in a part of the partition wall outside of the at least one pair of adjacent sub pixels.

The partition wall may include a pixel defining layer and a spacer on the pixel defining layer.

The method may further include removing the partition wall between the at least one pair of adjacent sub pixels.

BRIEF DESCRIPTION OF THE DRAWINGS

The above and other features and aspects of embodiments of the present invention will become more apparent by describing in detail exemplary embodiments thereof with reference to the attached drawings in which.

DETAILED DESCRIPTION

Figure 1:
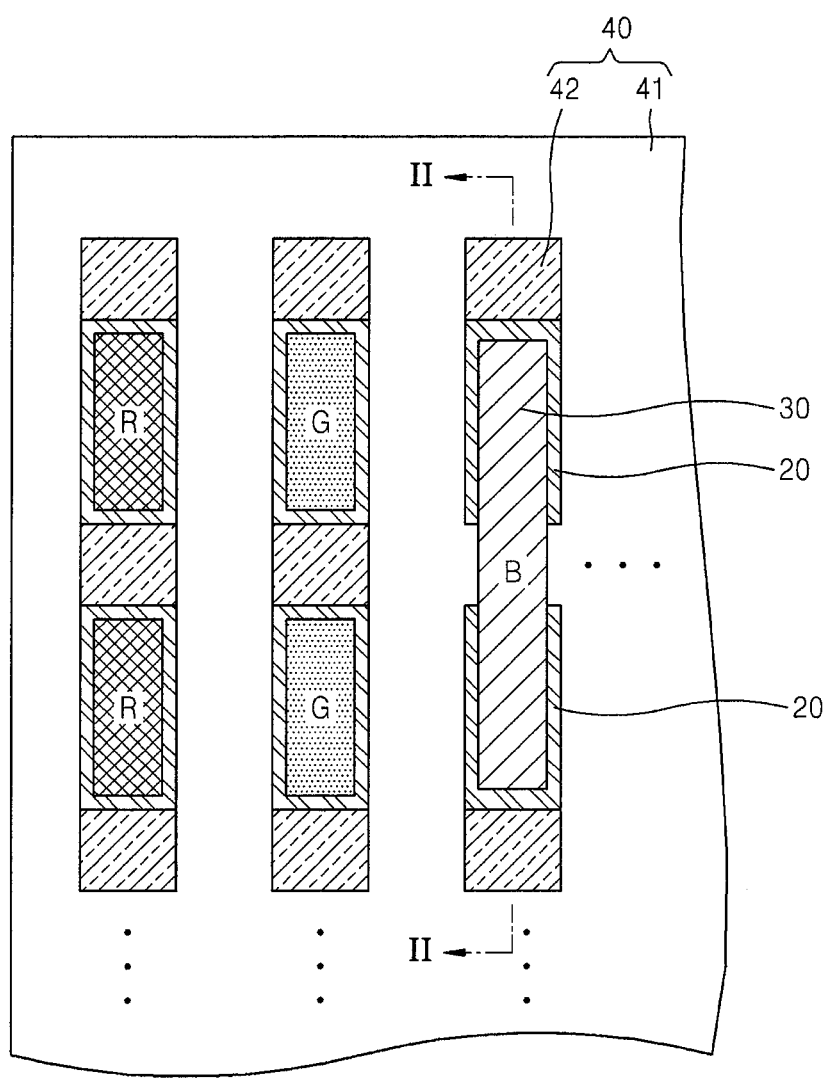
FIG. 1 is a plan view of sub pixels of an organic light emitting display device according to an embodiment of the present invention.

Hereinafter, exemplary embodiments of the present invention will be described in detail with reference to the accompanying drawings.

In drawings, like reference numerals denote like elements. While describing embodiments of the present invention, detailed descriptions about related well-known functions or configurations that may diminish the clarity of the points of the present invention are omitted.

In the drawings illustrating embodiments of the present invention, some layers or regions may be exaggerated for clarity. Also, it will be understood that when a portion, such as a layer, film, region, or plate, is referred to as being "on" another portion, it can be "directly on" or an intervening portion may be present.

Figure 2:
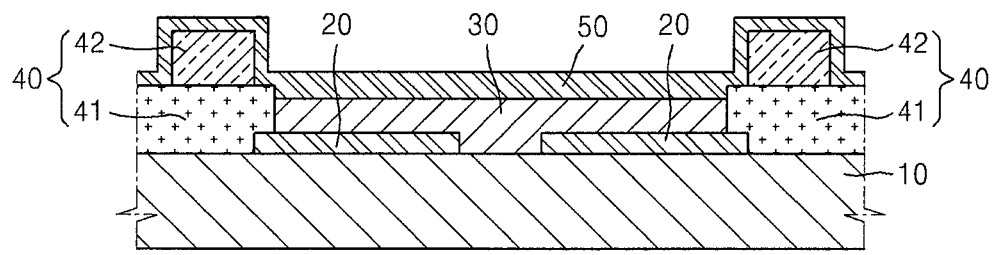
FIG. 2 is a cross-sectional view taken along a line II-II of FIG. 1.

FIG. 1 is a plan view of sub pixels of an organic light emitting display device according to an embodiment of the present invention, and FIG. 2 is a cross-sectional view taken along a line II-II of FIG. 1.

Referring to FIG. 1, the organic light emitting display device according to one embodiment includes red, green, and blue sub pixels R, G and B.

Regions of the red, green, and blue sub pixels are separated from each other by a partition wall 40 in which a pixel defining layer 41 and a spacer 42 are stacked in two stages, and in the embodiment shown in FIG. 1, two blue sub pixels B form a pair having emissive layers 30 that are connected to each other (e.g., are continuous). In other words, the blue sub pixel B is formed by pairing up two sub pixels, removing the partition wall 40 therebetween and connecting the emissive layers 30 of the pair of two sub pixels such that the partition wall is not located between the pair of two sub pixels.

FIG. 2 is a cross-sectional view of the organic light emitting display device of the embodiment of FIG. 1, wherein pixel electrodes 20 of each of two sub pixels are formed on a substrate 10, and the partition wall 40 is formed outside the two sub pixels. In this embodiment, instead of the partition wall 40 between the two sub pixels, the emissive layers 30 are connected to each other and the partition wall 40 is not located between the two sub pixels. Although the emissive layers 30 of the two sub pixels are connected to each other, the pixel electrodes 20 facing a counter electrode 50 are individually formed for each sub pixel, and thus each sub pixel is capable of individual emission (e.g., each sub pixel may be independently controlled).

When such a structure is used, the number of partition walls 40 between the sub pixels is significantly reduced. For example, when the two blue sub pixels B are paired up and the partition wall 40 therebetween is removed and not located between the two blue sub pixels B like in the structure of the embodiment shown in FIGS. 1 and 2, the number of partition walls 40 of the blue sub pixels B are reduced almost by half. Accordingly, the probability of cracking a bottom layer due to an external force may also be reduced proportionally. In other words, because the partition wall 40 is a portion protruding upward by forming a stepped portion on the substrate 10, stress may be concentrated on the stepped portion when an external force is applied, thereby potentially causing cracking the bottom layer. However, when the number of partition walls 40 is reduced as shown in the embodiment of FIGS. 1 and 2, the probability of cracking of the bottom layer is reduced accordingly. Thus, the possibility of a short circuit due to the pixel electrode 20 and the counter electrode 50 directly contacting each other due to a crack may be reduced or prevented, and, as such, a sub pixel where the short circuit occurs may be prevented from turning into a dark spot. Furthermore, luminance may be improved as the number of partition walls 40 constituting a non-light emitting unit (or non-light emitting regions) is reduced.

According to experiments, when the number of partition walls 40 of the blue sub pixels B was reduced as shown in the embodiment of FIGS. 1 and 2 in an organic light emitting display device having a 400×m800 sub pixel resolution of each red, green, and blue, a dark spot generation rate was reduced by about 17% and luminance was improved by about 4%.

Accordingly, a more stable organic light emitting display device having a reduced dark spot generation rate and improved luminance may be obtained.

Such a sub pixel according to the embodiment shown in FIGS. 1 and 2 may be manufactured as follows.

Figure 3A:
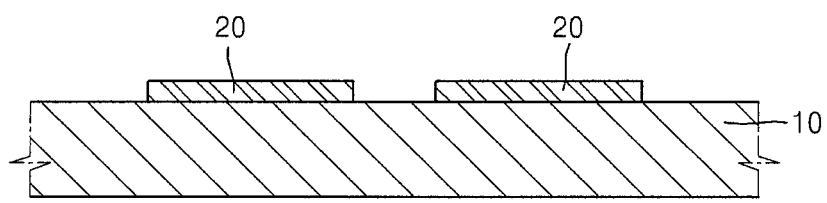
FIGS. 3A, 3B, 3C, 3D, and 3E are cross-sectional views sequentially illustrating processes of manufacturing a sub pixel according to the embodiment shown in FIG. 2.

FIGS. 3A through 3E are cross-sectional views sequentially illustrating processes of manufacturing a sub pixel as shown in FIG. 2 according to one embodiment of the present invention. First, as shown in FIG. 3A, the pixel electrode 20 of each sub pixel is formed on the substrate 10.

Figure 3B:
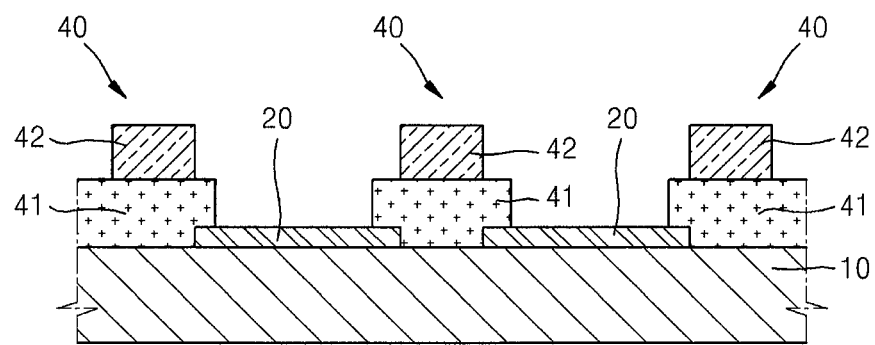

Then, as shown in FIG. 3B, the pixel defining layer 41 and the spacer 42 are sequentially formed to form the partition wall 40 defining regions of the sub pixels.

Figure 3C:
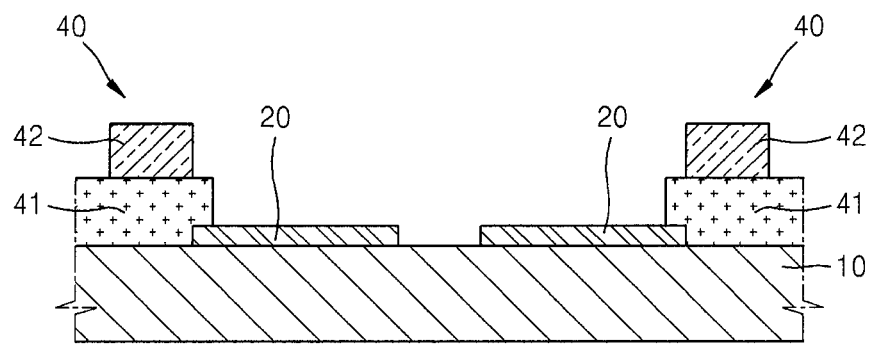

Next, the partition wall 40 between the two sub pixels is removed. Then, as shown in FIG. 3C, two sub pixels are paired up, where the partition wall 40 exists only on the outside and does not exist between the two sub pixels shown in FIG. 3C.

Figure 3D:
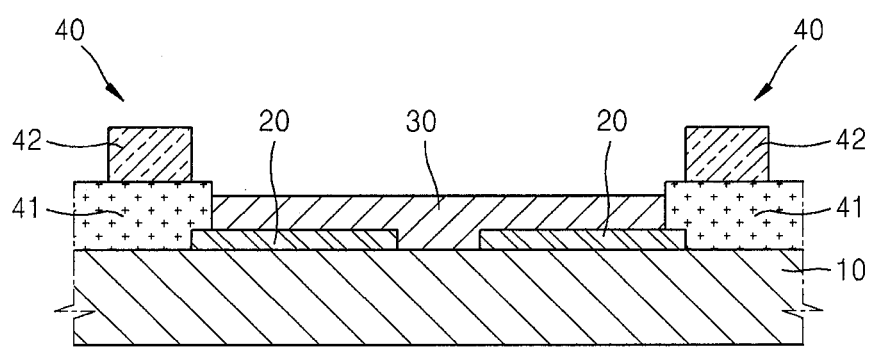

At this time, when the emissive layer 30 is formed, the emissive layers 30 of the two sub pixels are connected to each other as shown in FIG. 3D.

Figure 3E:
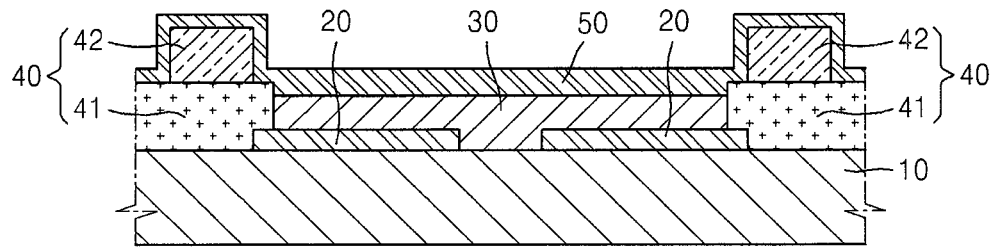

Next, when the counter electrode 50 is formed, the structure of the sub pixel shown in FIG. 3E is completed.

Because an organic light emitting display device including such a sub pixel has a low number of partition walls 40 that may be easily cracked by an external force as described above, a generation rate of dark spots caused by short circuits may be reduced, and luminance may be improved as the number of partition walls 40 that act as a non-light emitting regions is reduced.

Figure 4:
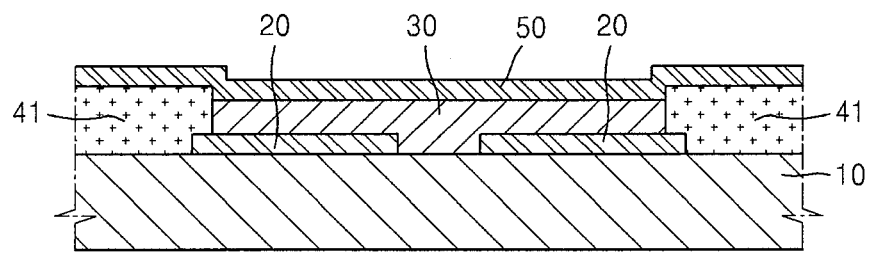
FIG. 4 is a cross-sectional view showing a modified version of the structure shown in FIG. 2 according to another embodiment of the present invention.

In the embodiment described above, the partition wall 40 between the two sub pixels is removed while maintaining the partition wall 40 outside the two sub pixels. As shown in FIG. 4, in some embodiments, the partition wall 40 outside the two sub pixels may have a structure in which the partition wall 40 includes the pixel defining layer 41 but not the spacer (e.g., the spacer 42 shown in FIG. 2) because the spacer layer 42 is removed or otherwise not present (e.g., not deposited on the substrate 10).

Figure 5A:
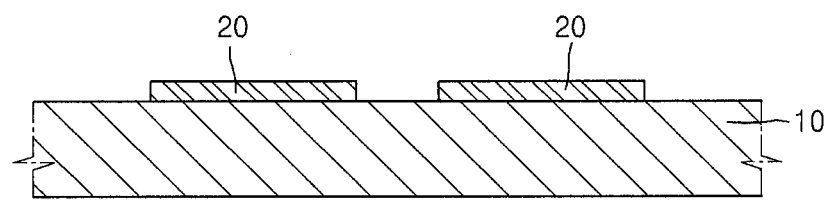
FIGS. 5A, 5B, 5C, 5D, and 5E are cross-sectional views sequentially illustrating processes of manufacturing a sub pixel according to the embodiment shown in FIG. 4.

According to one embodiment, a structure according to the embodiment of FIG. 4 may be manufactured via processes shown in FIGS. 5A through 5E. First, as shown in FIG. 5A, the pixel the pixel electrode 20 of each sub pixel is formed on the substrate 10.

Figure 5B:
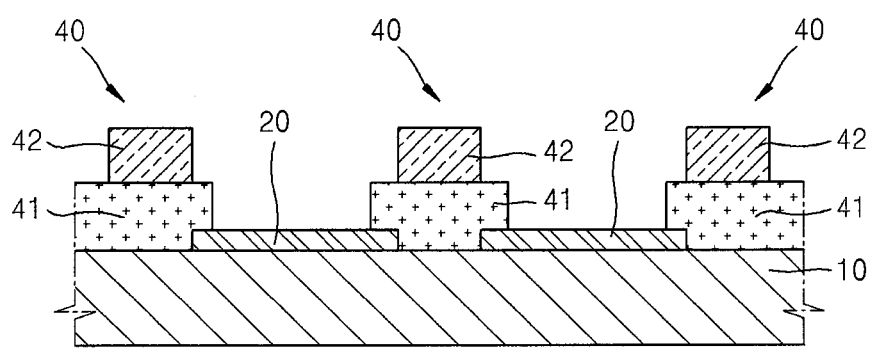

Then, as shown in FIG. 5B, the pixel defining layer 41 and the spacer 42 are sequentially formed as the partition wall 40 for defining regions of the sub pixels.

Figure 5C:
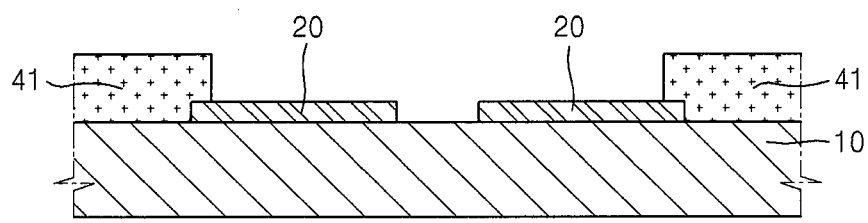

Next, the entire partition wall 40 between the two sub pixels, and the spacer 42 of the partition wall 40 outside the two sub pixels are removed to produce the structure as shown in FIG. 5C, where the two sub pixels are paired up and wherein only the pixel defining layer 41 is maintained outside the pair and the partition wall 40 between the pair of sub pixels is removed.

Figure 5D:
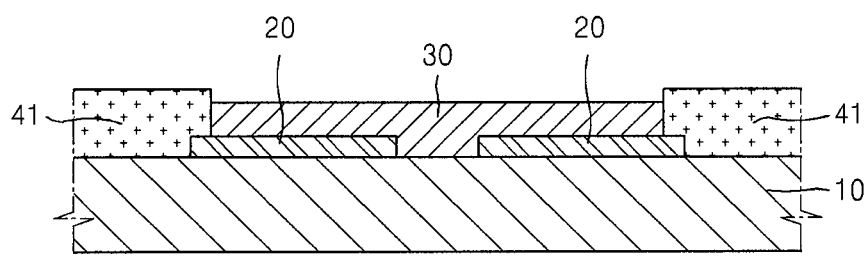

When the emissive layer 30 is formed at this time, the emissive layers 30 of the two sub pixels are connected to each other (e.g., continuous) as shown in FIG. 5D.

Figure 5E:
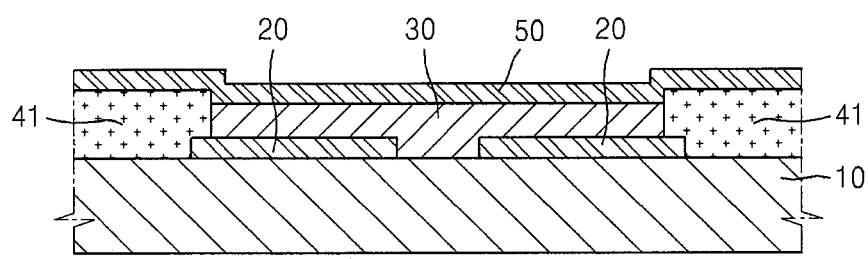

Then, the counter electrode 50 is formed to complete the structure of the sub pixel as shown in FIG. 5E.

Accordingly, according to an embodiment of the present invention as shown in FIG. 4 a height of the stepped portion of the remaining partition wall 40 is decreased, and the generation of cracks may be further suppressed, thereby realizing a more stable organic light emitting display device.

In the embodiments of the present invention shown in FIGS. 1, 2, and 4, the number of partition walls 40 of the blue sub pixels B is reduced. However, in other embodiments of the present invention, the number of partition walls 40 of another color from among the red, green, and blue sub pixels R, G, and B may also be reduced in a substantially similar manner.

As described above, in the organic light emitting display device and the method of manufacturing the organic light emitting display device according to the embodiments of the present invention, the generation of dark spots caused by short circuits in pixels may be reduced or suppressed, and as a result, improved stability may be obtained.

According to the organic light emitting display device and the method of manufacturing the organic light emitting display device according to embodiments of the present invention described above, the generation of dark spots caused by short circuits in pixels may be reduced and luminance may be improved, and as a result, a stable organic light emitting display device can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. An organic light emitting display device comprising:
a plurality of sub pixels, each of the sub pixels comprising an emissive layer between a pixel electrode and a counter electrode; and
a partition wall defining regions within the plurality of sub pixels,
wherein the partition wall is not located between at least one pair of adjacent sub pixels of the plurality of sub pixels.

2. An organic light emitting display device comprising
a plurality of sub pixels each of the sub pixels comprising an emissive layer between a pixel electrode and a counter electrode; and
a partition wall defining regions of the plurality of sub pixels,
wherein the partition wall is not located between at least one pair of adjacent sub pixels of the plurality of sub pixels, and
wherein the emissive layer of each of the plurality of sub pixels is adapted to emit one of red, green, and blue light, and the emissive layers of the at least one pair of adjacent sub pixels are adapted to emit light of the same color.

3. The organic light emitting display device of claim 2, wherein the emissive layers of the at least one pair of adjacent sub pixels are connected to each other.

4. The organic light emitting display device of claim 3, wherein a part of the partition wall outside of the at least one pair of adjacent sub pixels has a single layer.

5. An organic light emitting display device comprising:
a plurality of sub pixels each of the sub pixels comprising an emissive layer between a pixel electrode and a counter electrode; and
a partition wall defining regions of the plurality of sub pixels,
wherein the partition wall is not located between at least one pair of adjacent sub pixels of the plurality of sub pixels, and
wherein the partition wall comprises a pixel defining layer and a spacer on the pixel defining layer.

6. A method of manufacturing an organic light emitting display device, the method comprising:
forming a pixel electrode in each of a plurality of sub pixels;
forming a partition wall defining regions within the plurality of sub pixels, wherein the partition wall is not located between at least one pair of adjacent sub pixels of the plurality of sub pixels;
forming an emissive layer on the pixel electrode of each of the plurality of sub pixels; and
forming a counter electrode on the emissive layer.

7. A method of manufacturing an organic light emitting display device, the method comprising:
forming a pixel electrode in each of a plurality of sub pixels;
forming a partition wall defining regions of the plurality of sub pixels, wherein the partition wall is not located between at least one pair of adjacent sub pixels of the plurality of sub pixels;
forming an emissive layer on the pixel electrode of each of the plurality of sub pixels; and
forming a counter electrode on the emissive layer,
wherein the emissive layer of each of the plurality of sub pixels is adapted to emit one of red, green, and blue light, and the at least one pair of adjacent sub pixels comprise emissive layers adapted to emit light of the same color.

8. The method of claim 7, wherein the emissive layers of the at least one pair of adjacent sub pixels are connected to each other.

9. The method of claim 8, wherein a part of the partition wall outside of the at least one pair of adjacent sub pixels has a single layer.

10. A method of manufacturing an organic light emitting display device, the method comprising:
forming a pixel electrode in each of a plurality of sub pixels;
forming a partition wall defining regions of the plurality of sub pixels, wherein the partition wall is not located between at least one pair of adjacent sub pixels of the plurality of sub pixels;
forming an emissive layer on the pixel electrode of each of the plurality of sub pixels; and
forming a counter electrode on the emissive layer,
wherein the partition wall comprises a pixel defining layer and a spacer on the pixel defining layer and wherein the method further comprises removing the spacer in a part of the partition wall outside of the at least one pair of adjacent sub pixels.

11. A method of manufacturing an organic light emitting display device, the method comprising:
forming a pixel electrode in each of a plurality of sub pixels;
forming a partition wall defining regions of the plurality of sub pixels, wherein the partition wall is not located between at least one pair of adjacent sub pixels of the plurality of sub pixels;
forming an emissive layer on the pixel electrode of each of the plurality of sub pixels; and
forming a counter electrode on the emissive layer,
wherein the partition wall comprises a pixel defining layer and a spacer on the pixel defining layer.

12. A method of manufacturing an organic light emitting display device, the method com
forming a pixel electrode in each of a plurality of sub pixels;

forming a partition wall defining regions of the plurality of sub pixels, wherein the partition wall is not located between at least one pair of adjacent sub pixels of the plurality of sub pixels;

forming an emissive layer on the pixel electrode of each of the plurality of sub pixels; and forming a counter electrode on the emissive layer, further comprising removing the partition wall between the at least one pair of adjacent sub pixels.

* * * * *